United States Patent
Privitera et al.

(10) Patent No.: US 10,535,587 B2
(45) Date of Patent: Jan. 14, 2020

(54) INTEGRATED ELECTRONIC DEVICE HAVING A DISSIPATIVE PACKAGE, IN PARTICULAR DUAL SIDE COOLING PACKAGE

(71) Applicant: STMICROELECTRONICS S.R.L., Agrate Brianza (IT)

(72) Inventors: Concetto Privitera, Gravina di Catania (IT); Maurizio Maria Ferrara, Catania (IT); Fabio Vito Coppone, Tremestieri Etneo (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 144 days.

(21) Appl. No.: 14/961,586

(22) Filed: Dec. 7, 2015

(65) Prior Publication Data

US 2016/0225699 A1    Aug. 4, 2016

(30) Foreign Application Priority Data

Feb. 4, 2015 (IT) ................ TO2015A0081

(51) Int. Cl.
*H01L 23/495* (2006.01)
*H01L 23/34* (2006.01)
*H01L 23/00* (2006.01)

(52) U.S. Cl.
CPC ........ *H01L 23/49503* (2013.01); *H01L 23/34* (2013.01); *H01L 24/83* (2013.01); *H01L 2924/173* (2013.01)

(58) Field of Classification Search
CPC ......... H01L 23/49503; H01L 23/49524; H01L 24/83; H01L 2924/173; H01L 23/34; H01L 23/49568; H01L 23/40; H01L 23/345; H01L 23/4093; H01L 23/3736
USPC ................ 257/675, 712, 718, 720
See application file for complete search history.

(56) References Cited

U.S. PATENT DOCUMENTS

| 7,968,982 | B2* | 6/2011 | Wu ..................... | H01L 21/4828 257/675 |
| 2008/0087992 | A1 | 4/2008 | Shi et al. | |
| 2009/0283919 | A1* | 11/2009 | Tsui .................... | H01L 23/4334 257/778 |
| 2010/0133670 | A1* | 6/2010 | Liu .................... | H01L 23/49524 257/675 |
| 2011/0012264 | A1* | 1/2011 | Linderman ....... | H01L 31/02008 257/773 |

(Continued)

FOREIGN PATENT DOCUMENTS

| EP | 2 525 394 A1 | 11/2012 |
| JP | 2001-339028 A | 12/2001 |

*Primary Examiner* — Kimiberly N Rizkallah
*Assistant Examiner* — Dilinh P Nguyen
(74) *Attorney, Agent, or Firm* — Seed Intellectual Property Law Group LLP

(57) ABSTRACT

Packaged semiconductor device having a frame, of conductive material; a body of semiconductor material, fixed to the frame through a first adhesive layer; a heat-sink element, fixed to the body through a second adhesive layer; and a packaging mass surrounding the body and, at least partially, the frame and the heat-sink element. The heat-sink element is formed by a heat-sink die facing, and coplanar to, a main face of the device and by a spacer structure, which includes a pair of pedestals projecting from the perimeter of the heat-sink die towards the body and rest on the body.

19 Claims, 3 Drawing Sheets

(56) References Cited

U.S. PATENT DOCUMENTS

2011/0260314 A1* 10/2011 Minotti ............ H01L 23/49524
                                                                                       257/693
2013/0154155 A1    6/2013 Casabianca et al.

* cited by examiner

Known Art

Known Art

Known Art

INTEGRATED ELECTRONIC DEVICE HAVING A DISSIPATIVE PACKAGE, IN PARTICULAR DUAL SIDE COOLING PACKAGE

BACKGROUND

Technical Field

The present disclosure relates to an integrated electronic device having a dissipative package, in particular dual side cooling package.

Description of the Related Art

As is known, in the majority of integrated electronic devices, for example in power devices that dissipate high amounts of heat, the current flow is of a vertical type, i.e., directed from the bottom face to the top face (or vice versa) of the body or die of semiconductor material integrating the integrated electronic device. Consequently, both the faces of the die are involved in dissipation of the heat generated during operation of the integrated electronic device.

To improve dissipation, dual side-cooling (DSC) packages are already available and enable extraction of the heat from both sides of the die.

Known DSC packages are manufactured using various assembly processes and generally have dissipative structures arranged on or coupled to both sides of the die. For example, on one side, generally the underside to be fixed to a support, such as a printed-circuit board (PCB), the dissipative structure may be formed by a metal frame on which the die is fixed and which forms access terminals of the package. On the opposite side, DSC packages include a plate (commonly known as clip), also of good heat-conducting material, in general a metal, such as copper.

An example of a device with DSC package is shown in FIGS. 1 to 3. In particular, FIGS. 1 to 3 show a device 1 of a surface-mount type that includes components encapsulated in a packaging mass 2. The packaging mass 2 is of insulating material, such as plastic, epoxy resin, or ceramic. The device 1 has two main faces 3A, 3B, a first face 3A which is designed to be mounted on a structure such as a printed-circuit board (PCB) (not shown) and a second face 3A, which is generally exposed towards the outside.

The packaging mass 2 incorporates a body or die 5 (FIG. 3) manufactured using semiconductor technologies and integrating an integrated component or circuit, for example a power transistor. Typically, in a way not shown, the die 5 may comprise a monolithic substrate of semiconductor material, such as silicon, covered by insulating layers surrounding conductive lines and connection structures, for example of aluminum. The die 5 is fixed, through a first adhesive layer 6, for example a so-called "solder" layer, to a frame 7 enabling electrical connection of the component or integrated circuit with an environment outside the device. The frame 7 comprises, in a known way, a bottom plate 7A, of a generally rectangular or square shape, and a plurality of terminals or pins 7B. The bottom plate 7A constitutes a substantial portion of the first face 3A, and the terminals 7B face the first face 3A as well as lateral faces 3C of the device 1, from which they may project (as shown in the embodiment) or to which they may be aligned (in a way not shown). In a known manner, a connection wire (not shown) connects one of the terminals 7B to a first contact pad (gate pad) formed on the body 1, and a metal clip (not shown) connects the other terminal 7B to another contact pad (source pad, not shown), which is also formed on the body 1.

The device 1 further comprises a heat-sink element 10, forming a so-called "clip". In detail, the heat-sink element 10 comprises a top plate 10A and a support portion 10B. The top plate 10A is fixed to the die 5 via a second adhesive layer 11 (for example, a PbSnAg-based solder paste) and faces the second face 3B of the device 1, and the support portion 10B is bent towards the terminals 7B of the frame 7, to which it may be bonded through one or more adhesive portions 12, generally formed after the first adhesive layer 6.

The device 1 may be obtained by adhering the die 5 to the frame 7 through the first adhesive layer 6; adhering the heat-sink element 10 to the die 5 and to the terminals 7B through the second adhesive layer 11 and the adhesive portion 12; inserting the assembly thus obtained in a mold, including a bottom half-mold, a top half-mold, and possibly a spacer; and filling the mold with the packaging mass (see, for example, U.S. Pat. Pub. No. 2013/0154155 filed in the name of the present applicant).

Ideally, design and manufacture of the device 1 with DSC package are directed to optimize the overall thermal efficiency and the outline of the package (also referred to as "package outline assembly"—POA), wherein the exposed face (not fixed to the die 5) of the top plate 10A is coplanar to the second face 3B of the device and has a regular shape, as large as possible. To this end, some parameters are involved, among which the thickness of the second adhesive layer 11, i.e., the distance between the die 5 and the top plate 10A, and the inclination of the top plate 10A, i.e., its arrangement parallel to the die 5 and to the second face 3B of the device 1.

In fact, the thickness of the second adhesive layer 11 (also referred to as "bond-line thickness"—BLT) determines the coplanarity between the top die plate 10A and the second face 3B. In case of a small thickness of the second adhesive layer 11, during molding of the packaging mass 2, part of the material may cover the top plate 10A at least partially, thus reducing the area of the exposed face thereof and thus the effectiveness of dissipation of the heat-sink element 10, or in any case may cause the presence of a non-desired step. Instead, in case of excessive thickness of the second adhesive layer 11, the top plate 10A is arranged at a greater height than the nominal height, thus creating problems during the molding step, since the top plate 10A may interfere with the mold and get damaged during closing. Furthermore, also in this case, the risk of lack of planarity exists.

The inclination of the top plate 10A affects the coplanarity between it and the second face 3B. In fact, in case of non-zero inclination, a part of the top plate 10A may project with respect to the second surface 3B and/or a part of the top plate 10A may be at a lower level than the second surface 3B of the device 1. In either case, the desired coplanarity is not achieved. Further, also here, possible parts at a lower level may be coated by the packaging mass 2. Consequently, problems may arise of molding and/or effectiveness and in any case the device does not correspond to the desired specifications. For forming the device 1 with DSC package various solutions are known:

Flat: the top plate 10A is formed by a portion with rectangular area; this solution is very simple and provides a large dissipative area that responds also geometrically to the market; however, the indicated coplanarity is not provided; in fact, the second adhesive layer 11 is laid in a molten phase, very liquid, so that its thickness is not well controlled;

V-shape: this is similar to the flat solution, but the top plate 10A has a patterned, irregular, shape, less appreciated by the market and with a reduced exposed surface, and thus with less effectiveness as to heat dissipation as compared to the previous solution; the V-shape solution further shares the limitations indicated for the flat solution;

Dimple: the top plate 10A has a series of dimples forming portions projecting towards the die; in practice, the top plate is not planar, and the projections form a sort of spacers to preset the distance between the body and the top plate; this solution has the disadvantage that the dimples are filled with the packaging mass during molding so that the heat-sink element 10 does not have a full rectangular area, and thus there may be a reduction of effectiveness, besides having a shape that does not meet market requirements;

Coined: the top plate 10A is coined for presenting lowered internal lines designed to rest directly on the die 5; this solution has the disadvantage that it has no end-of-travel control, and it is very difficult to ensure planarity;

Downset: the heat-sink element 10 has a plurality of bands with non-planar structure; this solution does not ensure planarity; furthermore the heat-sink element 10 has a very irregular shape;

Double clip: initially, a first clip or plate of an irregular shape (possibly having dimples) is formed directly on the body or at a short distance therefrom, and then a plate, intended to remain exposed, is fixed via another adhesive layer; this solution employs a complicated and costly process due to the presence of two steps for fixing two distinct elements.

BRIEF SUMMARY

One or more embodiments of the present disclosure may overcome one or more of the drawbacks discussed above. According to one embodiment of the present disclosure, a packaged device includes a frame of conductive material and first and second adhesive layers. The device further includes a die of semiconductor material coupled to the frame by the first adhesive layer. The device further including a heat-sink coupled to the die. The heat-sink includes a main portion and a spacer structure extending from the main portion. The main portion is coupled to the die by a second adhesive layer and the spacer structure is coupled to the die by a third adhesive layer. The third adhesive layer is thinner than the first adhesive layer. The device further includes a packaging mass surrounding the die and at least a portion of the frame and the heat-sink. The packaging mass has a surface that is coplanar with a surface of the main portion of the heat-sink.

BRIEF DESCRIPTION OF THE SEVERAL VIEWS OF THE DRAWINGS

For a better understanding of the present disclosure preferred embodiments thereof are now described, purely by way of non-limiting example, with reference to the attached drawings, wherein.

DETAILED DESCRIPTION

Figure 4:
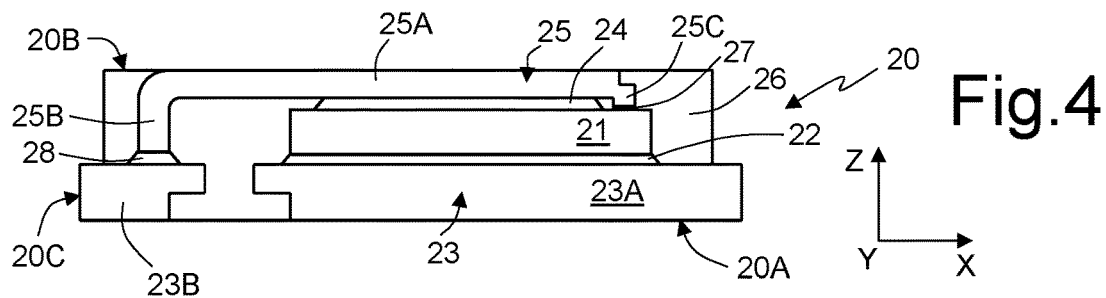
FIG. 4 is a cross-section of an embodiment of the present device with DSC package.
Figure 5:
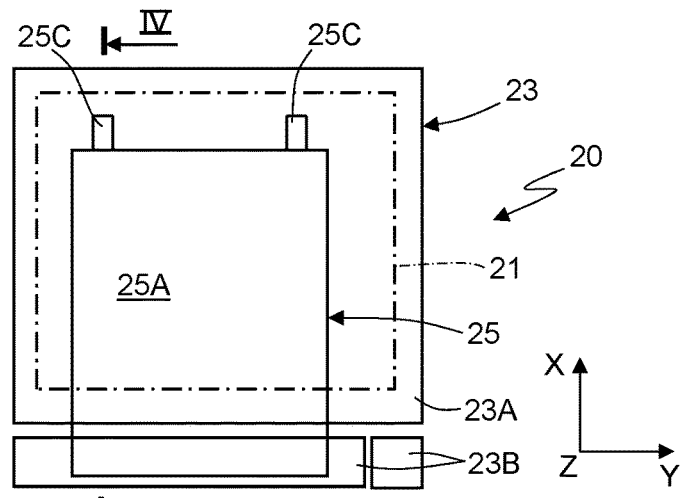
FIG. 5 is a see-through top plan view of a portion of the device of FIG. 4.
Figure 6:
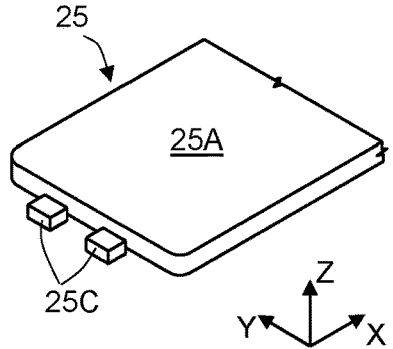
FIG. 6 is a perspective view of a detail of the device of FIG. 4.

FIGS. 4-6 show an embodiment of a device 20 with DSC packaging having a heat-sink element shaped to optimize the thermal efficiency and the outline of the package.

Figure 1:
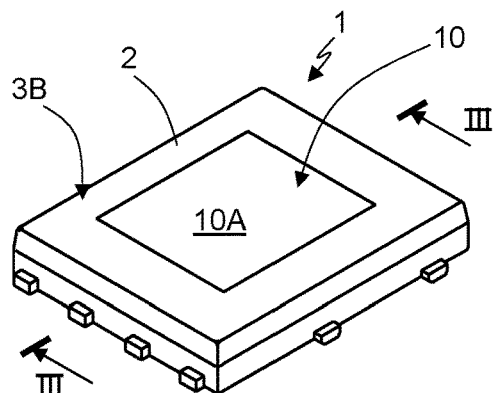
FIG. 1 is a perspective top view of a device with DSC package.

The device 20 has a general structure similar to that of the device 1 of FIG. 1, and comprises, in particular, a die 21 formed using semiconductor technology and coupled, through a first adhesive layer 22, to a frame 23, such as a leadframe, and, through a second adhesive layer 24, to a heat-sink element 25.

A packaging mass 26 surrounds the die 21. The device 20 thus has a generally parallelepipedal shape defining a first main face 20A, a second main face 20B, and lateral faces 20C. The die 21, the leadframe material, and packaging mass 26 are the same material as discussed in reference to device 1.

The main faces 20A, 20B define (in a Cartesian reference system) two axes here identified by X and Y, and the lateral faces 20C further define a third axis, here designated by Z.

The frame 23 comprises a plate 23A and terminals 23B, which are aligned and have an outer surface coplanar to the first main face 20A of the device 20.

The heat-sink element 25 is also here formed by a top plate 25A and by a support portion 25B, similar to the corresponding parts of the heat-sink element 10 of FIG. 1. In particular, the top plate 25A has a generally parallelepipedal shape with an outer face (not fixed to the die 21) of a rectangular shape lying in a plane parallel to the plane XY and coplanar to the top surface 20B of the device 20. The support portion 25B extends in a transverse direction from one of the sides of the rectangular shape, and more in particular in the direction of axis Z, as far as the terminals 23B, to which it is fixed through one or more adhesive portions 28.

As discussed above, in a known manner, a connection wire (not shown) connects one of the terminals 23B to a first contact pad (gate pad) formed on the body 20, and a metal clip (not shown) connects the other terminal 23B to another contact pad (source pad, not shown), which is also formed on the body 20.

The heat-sink element 25 further has a pair of lowered spacer elements or pedestals 25C, which extend and project from the perimeter of the top plate 25A. In FIGS. 4 and 5, the pedestals 25C extend from the side of the top plate 25A opposite to the support portion 25B.

FIG. 5 is a top plan view of the device 20 without the packaging mass 26, while FIG. 6 is a partial isometric view of the heat sink element 25. The pedestals 25C project, with respect to the top plate 25A, both laterally in direction XY, as may be seen in particular from the top plan view of FIG. 5 and in the perspective view of FIG. 6, and in direction Z, as may be seen in the cross-section of FIG. 4 and in the perspective view of FIG. 6. In particular, the pedestals 25C rest directly on the die 21 and ensure, together with the support portion 25B, positioning of the top plate 25A at the height set during design, such as to ensure the desired thickness of the second adhesive layer (i.e., of the preset BLT).

The pedestals 25C are made in a single piece, and are thus monolithic, with the heat-sink element 25 using a technique that enables correct sizing thereof, for example via coining.

It is to be noted that the pedestals are in contact with the die 21 with interposition of a third adhesive layer 27 of a smaller thickness as compared to the second adhesive layer 24. The third adhesive layer 27 may be of the same material as the second adhesive layer 24 (a solder paste or preform), but has a negligible thickness for ensuring exact vertical positioning and exact inclination of the top plate 25A with respect to the die 21. For example, the second adhesive layer 24 may have a thickness of approximately 25 µm, and the third adhesive layer 27 may have a thickness of 5 µm.

In this way, the position of the heat-sink element 25 with respect to the die 21 is predetermined and practically independent of the more or less fluid state of the second adhesive layer 24 during assembly.

Figure 2:
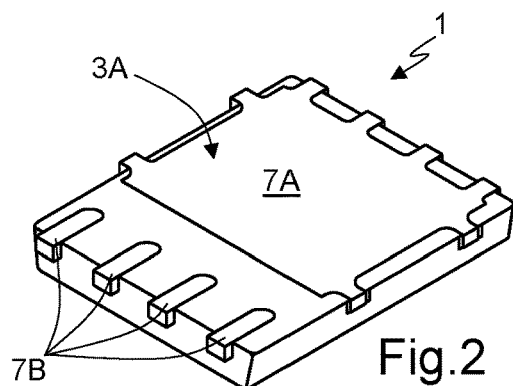
FIG. 2 is a perspective bottom view of the device of FIG. 1.
Figure 3:
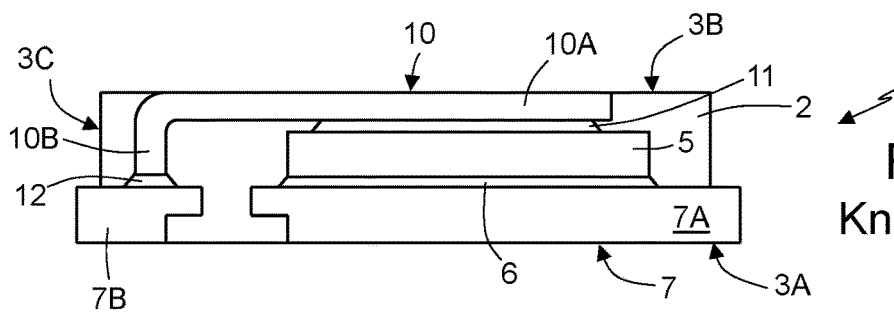
FIG. 3 is a cross-section of the device of FIGS. 1 and 2.

Due to the not coplanar, namely lowered position of the pedestals 25C with respect to the outer face of the top plate 25A (that is the second main face 20B of the device 20), they are covered by the packaging mass 26 in the final molding step, such as the molding step described in reference to FIGS. 1-3, so that the finished device 20 has a thermal dispersion region of a rectangular shape corresponding to the area of the top plate 25A.

It follows that the device 20 has the DSC according to design, with a large exposed area, equal to the entire area of the top plate 25A. Assembly is optimized, since deposition of the second adhesive layer 24 is not critical, and no further steps are envisaged, as in the double-clip solution. Furthermore, the shape of the exposed area of the top plate 25A may be designed at will; in particular, it may be rectangular or square.

Further, the position of the pedestals 25C may be chosen as desired, on the basis of the dimensions and layout of the die 21, as shown, for example, in FIGS. 7-12.

Figure 7:
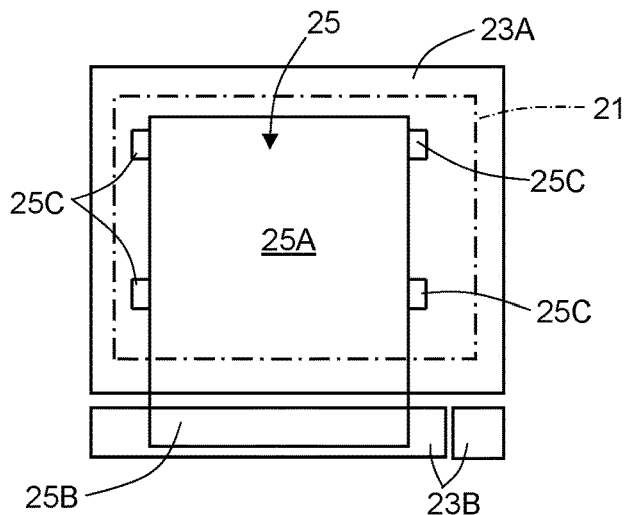
FIGS. 7 to 9 are see-through top plan views of different embodiments of the present device.

FIG. 7 shows an embodiment of the device 20 where the pedestals 25C are arranged on the sides adjacent to that of the support portion 25B. Further four pedestals 25C are provided, two for each side.

Figure 8:
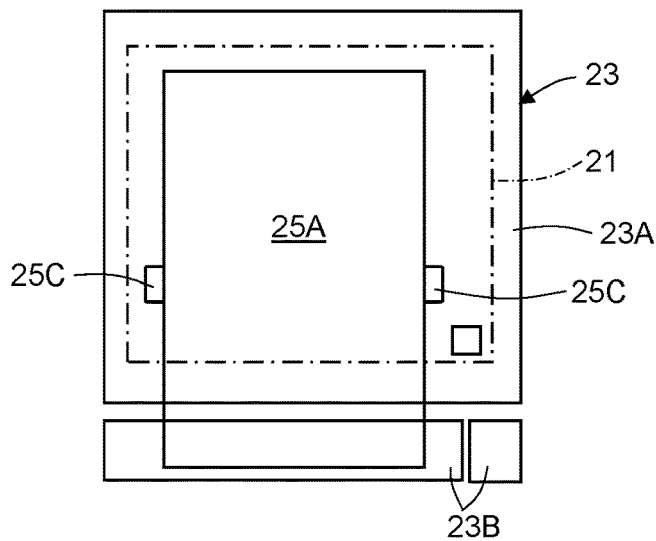

FIG. 8 shows an embodiment of the device 20 where two pedestals 25C are arranged on the sides adjacent to that of the support portion 25B, and the top portion 25A extends, in direction X, so as not to project beyond the die 21.

Figure 9:
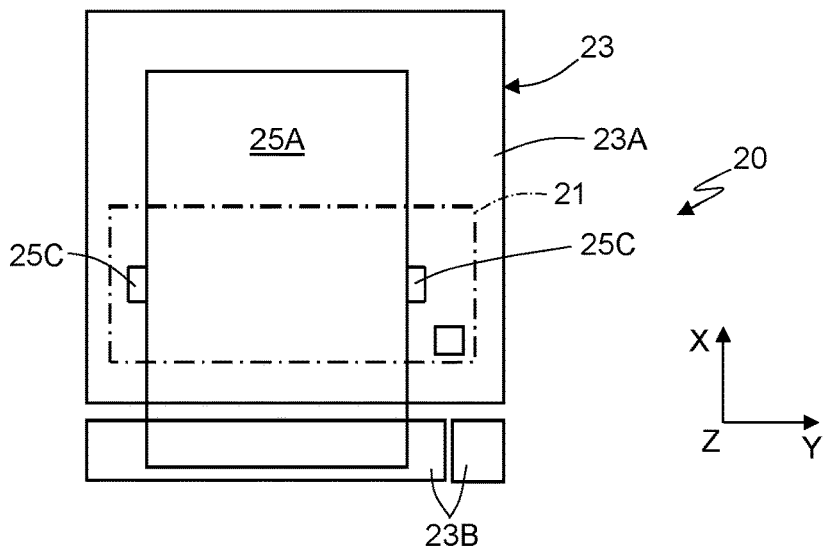

FIG. 9 shows an embodiment of the device 20 where the die 21 has a markedly rectangular shape, with its short sides parallel to the axis X, and the top portion 25A of the heat-sink element 25 projects beyond the die 21 in the direction X.

Figure 10:
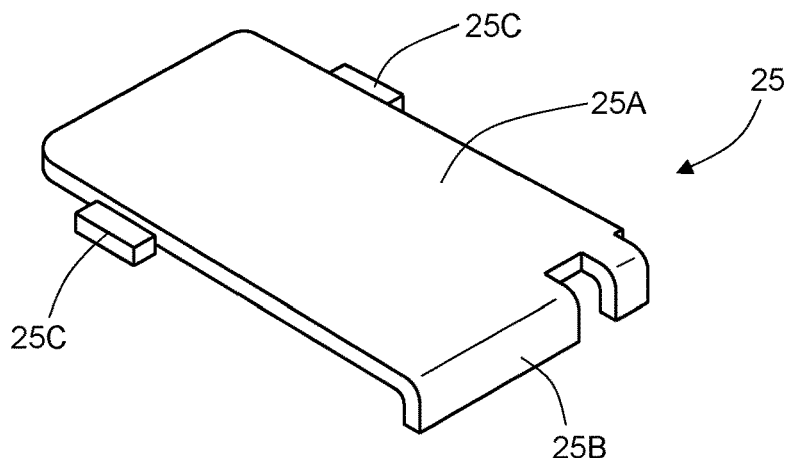
FIG. 10 is a perspective view of an embodiment of a detail of the present device.

FIG. 10 shows a different embodiment of the heat-sink element 25, wherein the heat-sink element 25 has lateral pedestals 25C, projecting from the long sides of the top plate 25A, parallel to axis X, and a support portion 25B divided into two parts.

Figure 11:
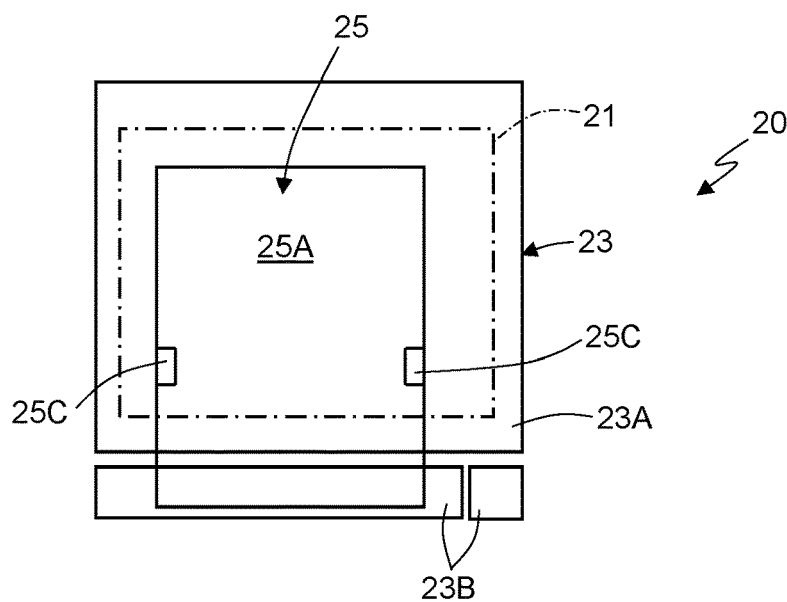
FIG. 11 is a see-through top plan view of another embodiment of the present device.
Figure 12:
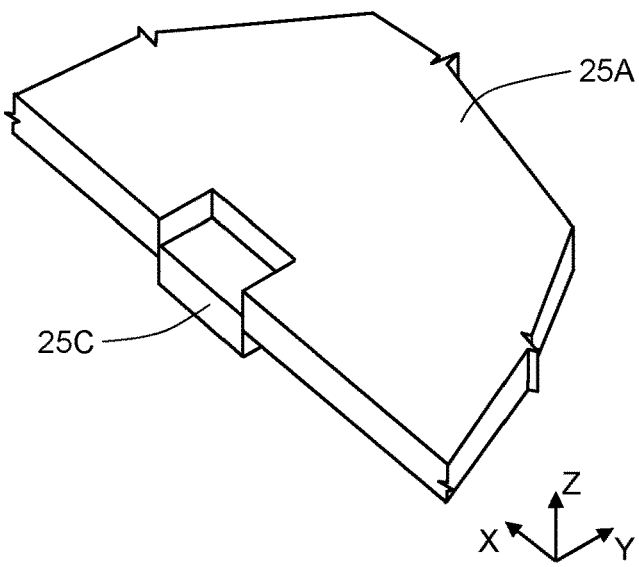
FIG. 12 is a perspective view of a detail of the device of FIG. 11.

FIGS. 11 and 12 show an embodiment of the device 20 where the pedestals 25C are formed within the perimeter of the top plate 25A of the heat-sink element 25.

With this solution, the packaging mass 26, after molding, covers the pedestals 25C and the perimeter of the exposed face of the top plate 25A, after molding of the packaging mass 26, is no longer rectangular. This solution makes it, however, possible to have a regular and uniform exposed area.

Finally, it is clear that modifications and variations may be made to the device described and illustrated herein, without thereby departing from the scope of the present disclosure.

For example, the individual characteristics described with reference to each specific embodiment are in general interchangeable with other characteristics described with reference to different embodiments.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A packaged semiconductor device comprising:
a frame of conductive material;
first and second adhesive materials;
a die of semiconductor material fixed to the frame by the first adhesive material, the die having a surface having a center portion and a perimeter portion, the perimeter portion extending around the center portion;
a heat-sink including a main portion forming a main perimeter of the heat sink and a plurality of spacer structures extending laterally from the main perimeter of the main portion and vertically toward the die, the second adhesive material having a first portion that directly couples the main portion to at least the surface of the die at the center portion and a second portion that directly couples the plurality of spacer structures to the surface of the die at the perimeter portion, wherein the plurality of spacer structures project laterally at the main perimeter of the heat-sink and forms an outer perimeter edge of the heat-sink, the plurality of spacer structures having a surface that is a first distance from the die, the main portion having a surface that is a second distance from the die, wherein the first distance is less than the second distance; and
a packaging mass surrounding the die and at least a portion of the frame and the heat-sink, the packaging mass having a surface that is coplanar with a surface of the main portion of the heat-sink.

2. The device according to claim 1, wherein the plurality of spacer structures include at least two pedestals extending from a same side of the main perimeter portion of the main portion of the heat-sink and forms outer perimeter edges of the heat-sink.

3. The device according to claim 2, wherein the at least two pedestals are coined.

4. The device according to claim 1, wherein the frame includes a plate and at least one terminal, and the heat-sink includes a support portion that is bent, with respect to the main portion of the heat-sink, towards the terminal, the main portion of the heat-sink having a regular polygonal shape with sides, wherein a resting portion extends from a first side of the main portion of the heat-sink, and the plurality of spacer structures extend from a side opposite to the first side or from a side adjacent to the first side.

5. The device according to claim 1, wherein the heat-sink is made of a metal material.

6. The device according to claim 1, wherein the packaging mass completely covers the plurality of spacer structures.

7. The device according to claim 1, wherein the main portion of the heat-sink has a rectangular or square shape and is surrounded by the packaging mass, the main portion of the heat-sink having a surface that is completely exposed outside of the device.

8. The device according to claim 1, wherein the second adhesive material is a solder material, wherein:
   a first solder layer couples the main portion of the heat-sink to the die and has a first thickness, and
   a second solder layer couples the plurality of spacer structures to the die and has a second thickness smaller than the first thickness.

9. A semiconductor package comprising:
   a leadframe including a die pad and at least one terminal;
   a die of semiconductor material coupled to the die pad, the die having a surface having a center portion and a perimeter portion;
   a heat-sink including a main portion forming a main perimeter portion and a plurality of spacer structures extending laterally from a side of the main perimeter portion of the main portion and vertically towards the die, the main portion coupled to the center portion of the surface of the die by a first adhesive layer, the plurality of spacer structure coupled to the perimeter portion of the surface of the die by a second adhesive layer, the second adhesive layer being thinner than the first adhesive layer, the second adhesive layer being of a same adhesive material as the first adhesive layer, the plurality of spacer structures having a surface that is a first distance from the die, the main portion having a surface that is a second distance from the die, wherein the first distance is less than the second distance; and
   packaging material surrounding the die and a portion of the die pad and the heat-sink, the packaging material being a material that is distinct from the first and second adhesive layers, a surface of the main portion of the heat-sink remaining exposed from the packaging material.

10. The semiconductor package according to claim 9, wherein the plurality of spacer structures each have a width that is substantially less than a width of the side of the main perimeter portion.

11. The semiconductor package according to claim 9, wherein the first and second adhesive layers are solder and the packaging material is a molded packaging mass.

12. The semiconductor package according to claim 9, wherein the packaging material completely surrounds the plurality of spacer structures of the heat-sink.

13. The semiconductor package according to claim 9, wherein the plurality of spacer structures extend from a same side of the main perimeter portion.

14. A packaged semiconductor device comprising:
   a frame of conductive material including a die pad and a terminal;
   a die of semiconductor material coupled to the die pad, the die having a surface having a center portion and a perimeter portion;
   a heat-sink element coupled to the die, the heat-sink element having a main portion coupled to the surface of the die at the center portion, the main portion having a main perimeter, the heat-sink element having at least one pair of pedestals projecting laterally from side surfaces of the main perimeter of the main portion and projecting vertically towards the surface of the die at the perimeter portion, the at least one pair of pedestals being narrower than the side surfaces of the main perimeter, the at least one pair of pedestals being coupled to the surface of the die at the perimeter portion, the at least one pair of pedestals forming an outer perimeter edge of the heat-sink element, the at least one pair of pedestals having a surface that is a first distance from the die, the main portion having a surface that is a second distance from the die, wherein the first distance is less than the second distance; and
   a packaging material surrounding the die, and at least partially, the frame and the heat-sink element, the at least one pair of pedestals embedded in the packaging material, an outer surface of the packaging material being flush with an exposed surface of the heat-sink element.

15. The device according to claim 14, wherein the heat-sink element includes a support portion extending from the main portion towards the terminal, the support portion being bent and coupled to the terminal by an adhesive layer.

16. The device according to claim 15, wherein the at least one pair of pedestals project from a same side of the main portion of the heat-sink element.

17. The device according to claim 15, wherein each pedestals of the at least one pair of pedestals project from opposite sides of the main portion of the heat-sink element.

18. The device according to claim 15, wherein the at least one pair of pedestals extend from a side opposite the support portion.

19. The device according to claim 15, wherein the at least one pair of pedestals project from an end region of the main portion that is opposite from the support portion.

* * * * *